United States Patent
Pagani

(10) Patent No.: US 8,441,272 B2
(45) Date of Patent: May 14, 2013

(54) MEMS PROBE FOR PROBE CARDS FOR INTEGRATED CIRCUITS

(75) Inventor: Alberto Pagani, Nova Milanese (mi) (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 394 days.

(21) Appl. No.: 12/649,109

(22) Filed: Dec. 29, 2009

(65) Prior Publication Data
US 2010/0164526 A1  Jul. 1, 2010

(30) Foreign Application Priority Data
Dec. 30, 2008 (IT) .............................. MI2008A2347

(51) Int. Cl.
 *G01R 1/067* (2006.01)
(52) U.S. Cl.
 USPC ............ 324/755.07; 324/754.03; 324/754.07; 324/762.01; 324/756.03
(58) Field of Classification Search ............. 324/754.03, 324/754.07, 756.03, 755.07, 762.01; 439/66
See application file for complete search history.

(56) References Cited

U.S. PATENT DOCUMENTS

| | | | |
|---|---|---|---|
| 4,056,777 A | 11/1977 | Roch | |
| 5,475,318 A | 12/1995 | Marcus et al. | |
| 5,723,894 A | 3/1998 | Ueno et al. | |
| 6,181,144 B1 | 1/2001 | Hembree et al. | |
| 6,184,576 B1 | 2/2001 | Jones et al. | |
| 6,426,638 B1 | 7/2002 | Di Stefano | |
| 6,617,865 B2 * | 9/2003 | Di Stefano | ............... 324/755.07 |
| 6,811,406 B2 * | 11/2004 | Grube | .............................. 439/66 |
| 7,063,541 B2 * | 6/2006 | Grube et al. | .................... 439/66 |
| 7,579,856 B2 * | 8/2009 | Khandros et al. | ........ 324/755.07 |
| 7,602,204 B2 * | 10/2009 | Lee | ........................... 324/755.07 |
| 7,898,266 B2 * | 3/2011 | Bonin et al. | ................... 324/662 |

(Continued)

FOREIGN PATENT DOCUMENTS

| KR | 2005/00677 A | 7/2005 |
|---|---|---|
| KR | 20050067758 A | 7/2005 |

OTHER PUBLICATIONS

Italian Search Report dated Nov. 9, 2009 from corresponding Italian Application No. MI2008A002347.

(Continued)

*Primary Examiner* — Arleen M Vazquez
(74) *Attorney, Agent, or Firm* — Wolf, Greenfield & Sacks, P.C.

(57) ABSTRACT

A MEMS probe adapted to contact a corresponding terminal of an integrated circuit, integrated on at least one chip of a semiconductor material wafer during a test phase of the wafer is provided. The probe includes a support structure comprising a first access terminal and a second access terminal; the support structure defines a conductive path between said first access terminal and said second access terminal. The probes further-includes a probe region connected to the support structure adapted to contact the corresponding terminal of the integrated circuit during the test phase for providing at least one test signal received from the first access terminal and the second access terminal to the integrated circuit through at least one portion of the conductive path, and/or providing at least one test signal generated by the integrated circuit to at least one between the first access terminal and the second access terminal trough at least one portion of the conductive path. The probe region is arranged on the conductive path of the support structure between said first access terminal and said second access terminal.

35 Claims, 8 Drawing Sheets

U.S. PATENT DOCUMENTS

| | | | |
|---|---|---|---|
| 2002/0005728 A1 | 1/2002 | Babson et al. | |
| 2002/0113609 A1 | 8/2002 | Noda | |
| 2002/0153912 A1* | 10/2002 | Di Stefano | 324/754 |
| 2002/0180473 A1 | 12/2002 | Di Stefano | |
| 2004/0041581 A1* | 3/2004 | Saijyo et al. | 324/765 |
| 2004/0142583 A1 | 7/2004 | Mathieu et al. | |
| 2006/0038576 A1* | 2/2006 | Tadayon | 324/761 |
| 2007/0018664 A1* | 1/2007 | Bae et al. | 324/754 |
| 2007/0240306 A1* | 10/2007 | Ismail et al. | 29/874 |
| 2007/0296435 A1* | 12/2007 | Eldridge et al. | 324/761 |
| 2008/0231295 A1* | 9/2008 | Ruf | 324/754 |

OTHER PUBLICATIONS

Written Opinion dated Nov. 9, 2009 from corresponding Italian Application No. MI2008A002347.

Ito T., et al., *Micor IC Probe for LSI Testing, NTT Opto-electronics Laboratories*, Mar. 9, 2011 Midori-Chao, Musashino-Shi, Tokyo 180-8585 Japan, IEEE 1999, pp. 263-266.

European Search Report dated Mar. 26, 2010 from corresponding European Application No. 09181012.

* cited by examiner

MEMS PROBE FOR PROBE CARDS FOR INTEGRATED CIRCUITS

CROSS REFERENCE TO RELATED APPLICATIONS

This application claims the priority benefit of Italian patent application No. MI2008A002347, filed on Dec. 30, 2008, entitled "IMPROVED MEMS PROBE FOR PROBE CARDS FOR INTEGRATED CIRCUITS," which is hereby incorporated by reference to the maximum extent allowable by law.

BACKGROUND OF THE INVENTION

1. Field of the Invention

The present invention relates to systems for testing integrated circuits (IC) and particularly it relates to probe cards for testing ICs.

2. Discussion of the Related Art

The ICs are usually manufactured in form of dice on a semiconductor material wafer. Particularly, after the manufacturing operations, the semiconductor material wafer is subdivided in dice, each including a respective IC.

Before the ICs are encapsulated and sent to the buyers, and before the ICs are installed in complex electronic systems, they have to be tested in order to evaluate their functionality, and particularly for assessing that they are not defective. During the test, it is possible to detect information regarding global or local defects (such as the presence of short circuits and undesired breakings) and more generally regarding the operation of the IC on each tested dice (for example, checking the waveforms of one or more output signals generated by the IC on each tested die). In this way it is possible to make only the dice that have fulfilled predetermined requirement perform the subsequent phases of the manufacturing process (such as the connection of the terminal wires, the packaging and the final test).

According to a known test technique, the dice including the ICs are tested before the semiconductor material wafer is subdivided in single dice. The test performed at the wafer level is denoted "Wafer Sort" or "Electrical Wafer Sort" (EWS).

In order to perform the test, a test apparatus is employed. Such test apparatus comprises a tester coupled with the semiconductor material wafer comprising the die to be tested by means of a proper probe card.

The tester is adapted to manage the signals that are used for performing the test; in the following, such signals will be denoted "test signals". The test signals include test stimulus (for example, commands, memory location addresses, data to be written in the memory device) generated by the tester and sent to each die to be tested through the probe card, and test response signals, which are generated by the ICs integrated in each die during the test phase in response to the received test stimulus. The test response signals are sent by the IC integrated in each die to the tester through the probe card; such signals are then processed by the tester to the purpose of obtaining an indication regarding the correct/incorrect operation of the IC integrated in the dice.

In order to allow the exchange of test signals, the probe card is electrically coupled with the dice by means of proper probes. Particularly, the probe card includes of a Printed Circuit Board (PCB) connected to a plurality of mechanical probes adapted to physically contact input/output contact pads included in the dice to be tested.

Each input/output contact pad is formed by an enlarged metallization region surrounded and possibly partially covered by a passivation layer.

During the test, the contact pad is etched or scratched by the mechanical action exerted by the probe tip. In this way, it is possible to proceed to the test signals exchange between the tester and the die to be tested.

A first category of known probe cards comprises the probe cards provided with so-called cantilever probes. Such probes comprise a ring (for example made of aluminum, special alloys, or ceramic material) which is provided with an epoxidic support attached thereto. Such epoxidic support is adapted to support a plurality of test elements comprising elastic cantilever probes, made of an alloy having good electrical and mechanical properties. Particularly, each cantilever probe includes a beam having a first end connected to the epoxidic support and a second end including a tip, which in use it is directed to contact a contact pad of the die of the IC to be tested.

As an alternative to the probe cards including cantilever probes, it is possible to provide substantially vertical probes which comprise conductive wires passing through holes formed in a head of the probe card. In detail, the head of the probe card includes a top guide plate stacked on a bottom guide plate. Each probe has a tip protruding from the bottom guide plate and is adapted to electrically contacting the corresponding contact pads of the die to be tested. A contact interface known as space transformer is connected to the top guide plate and is adapted to electrically couple the probes to the PCB in such a way to allow the exchange of signals between the tester and the die to be tested.

A further type of probe card provides the use of microelectromechanical probes, or MEMS probes (wherein MEMS is the acronym of MicroElectroMechanical System). With the term of MEMS probe it is intended a probe obtainable through lithographic processes that are similar to those used for the manufacturing of the ICs. Thanks to the use of such lithographic processes it is possible to implement a great number of MEMS probes having sufficiently homogeneous structural and electrical features in a relatively economical way.

Among the various types of known MEMS probes for the use in the integrated circuits probe card field, one of the most widespread is constituted by an elastic metallic beam having an end that is connected to a substrate (for example, of a semiconductor or ceramic material) by means of one or more semiconductor support pillars, and the other end is connected to a protruding tip adapted to electrically contact the contact pads of the dice to be tested. The substrate is provided with proper conductive tracks connected to the support pillars. In this way, the exchange of test signals between the generic die and the tester through a MEMS probe may be implemented through a conductive path comprising the tip, the elastic beam, the support pillars and the conductive tracks formed in the substrate.

Further equivalent types of MEMS probes are known to those skilled in the art, such as probes constituted by a single properly shaped metallic beam that is directly connected to the substrate, probes constituted by a stringy elastic element connected to the substrate and provided with a laminar tip, probes comprising silicon beams, and probes constituted by thin bent foils made of conductive materials.

Each known MEMS probe is structured in such a way to comprise a single conductive path between the tip of the probe itself and the substrate to which it is connected. This feature complicates in a sensible way the probes' integrity verify operations. Such verify operations, required to individuate possible defective probes to be discarded and substituted, includes measurements of electric characteristics of the probes, such as the electric resistance of the probe. Since a known MEMS probe comprises a single conductive path between the tip of the probe itself and the substrate to which it is connected, the electric resistance of a MEMS probe is typically measured positioning the probe card on a conductive metallic plate in such a way the tip of the probe is in contact with such plate, and connecting a measuring device, between the metallic plate and an end of the conductive track of the substrate coupled with the probe. However, positioning the probe card on a metallic plate may be dangerous, since it is possible to damage the MEMS probes, and particularly, the tips thereof, in an irreversible way. Moreover, a measurement of such type requires the use of expensive apparatuses which have to be equipped with proper interfaces and instrumentations based on the structure of the probe card.

SUMMARY OF THE INVENTION

In view of the state of the art herein illustrated, it is an object of the present invention overcoming the abovementioned drawbacks.

Particularly, an aspect of the present invention regards a probe adapted to contact a corresponding terminal of an integrated circuit, integrated on at least one chip of a semiconductor material wafer during a test phase of the wafer. The probe includes a support structure comprising a first access terminal and a second access terminal; the support structure defines a conductive path between said first access terminal and said second access terminal. The probes further comprises a probe region connected to the support structure adapted to contact the corresponding terminal of the integrated circuit during the test phase for providing at least one test signal received from the first access terminal and the second access terminal to the integrated circuit through at least one portion of the conductive path, and/or providing at least one test signal generated by the integrated circuit to at least one between the first access terminal and the second access terminal trough at least one portion of the conductive path. Said probe region is arranged on the conductive path of the support structure between said first access terminal and said second access terminal.

A further aspect of the present invention regards a probe card.

A still further aspect of the present invention regards a test apparatus.

A further aspect of the present invention regards a method for verifying the integrity of the probes.

BRIEF DESCRIPTION OF THE DRAWINGS

A solution according to one or more embodiments of the invention, such as other features and advantages, will be best understood by reading the following detailed description of some embodiments thereof, given purely by way of a non-limitative example, to be read in conjunction with the accompanying drawings. In this respect, it is expressly intended that the figures are not necessary drawn to scale and that, unless otherwise indicated, they are merely intended to conceptually illustrate the structures and procedures described herein. Particularly.

DETAILED DESCRIPTION

Figure 1:
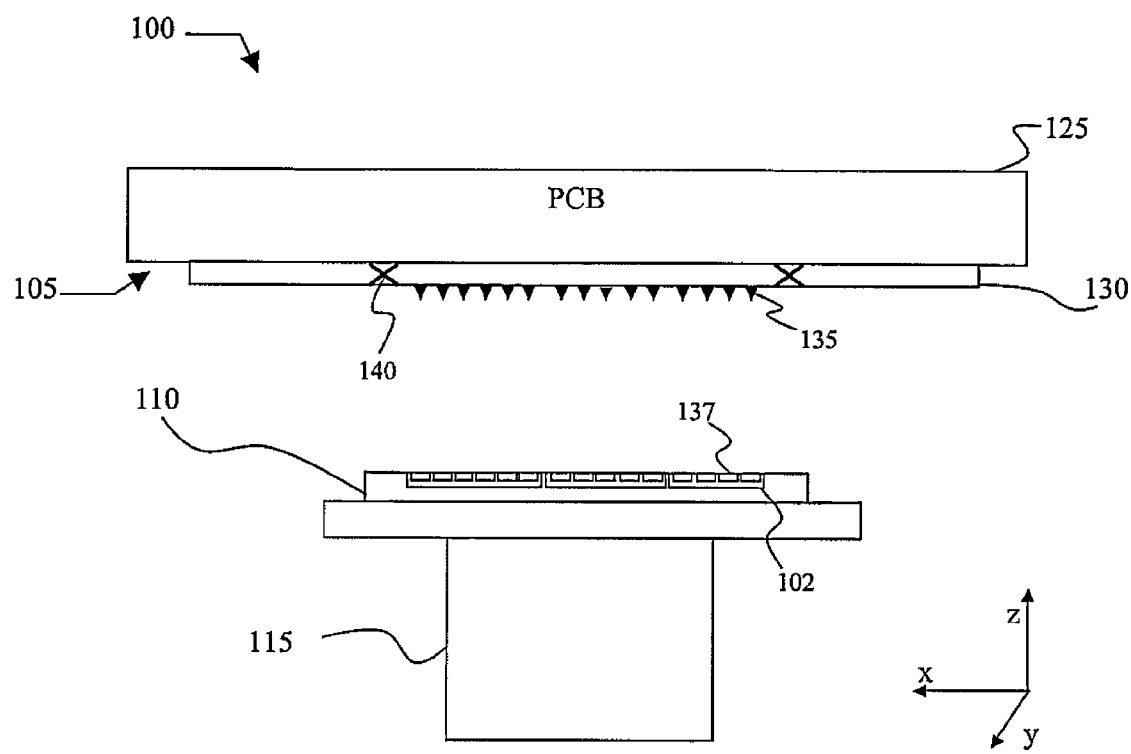
FIG. 1 schematically illustrates a sectional view of a test apparatus comprising a probe card for the electric coupling with a semiconductor wafer to be tested.

With reference to FIG. 1, there is schematically illustrated a sectional view of a portion of a test apparatus 100 comprising a probe card 105 adapted to electrically couple circuits integrated in dice 102 of a semiconductor material wafer 110 to be tested.

The wafer 110 is located on a chuck/hub 115 capable of being moved along the three orthogonal directions "x", "y" and "z" schematically shown in the figure; the chuck 115 may be further rotated and inclined. Once the semiconductor wafer 110 is positioned on the chuck 115, the latter is moved in such a way to bring the wafer 110 to be tested in contact with the probe card 105.

In the considered example, the probe card 105 includes a PCB 125 connected to a substrate 130 (for example, formed by a semiconductor or ceramic material). The substrate 130 supports a plurality of MEMS probes 135 adapted to electrically contact pads 137 formed on the dice 102 of the wafer 110 to be tested.

The PCB 125 comprises the circuits required for the communication between a tester (not illustrated in the figure) and the wafer 110 to be tested. For example, the PCB 125 comprises circuits for processing data/signals that control the whole operation of the probe card 105, and that may operate under the control of a software stored in a memory unit (for example, one or more memories included in the PCB 125).

Although in the considered example the probes 135 are supported by a substrate 130, the concepts of the present invention are applicable to the case of probes 135 directly connected to the PCB 125.

Particular or "fiducial" marks 140 may be provided on the PCB 125 or on the substrate 130 for allowing the correct alignment between the probe card 105 and the wafer 110.

The probes 135 are arranged on the substrate 130 in such a way each one of them results adapted to establish a relationship communication with a respective contact pad 137 of a die 102 of the wafer 110 to be tested.

Figure 2A:
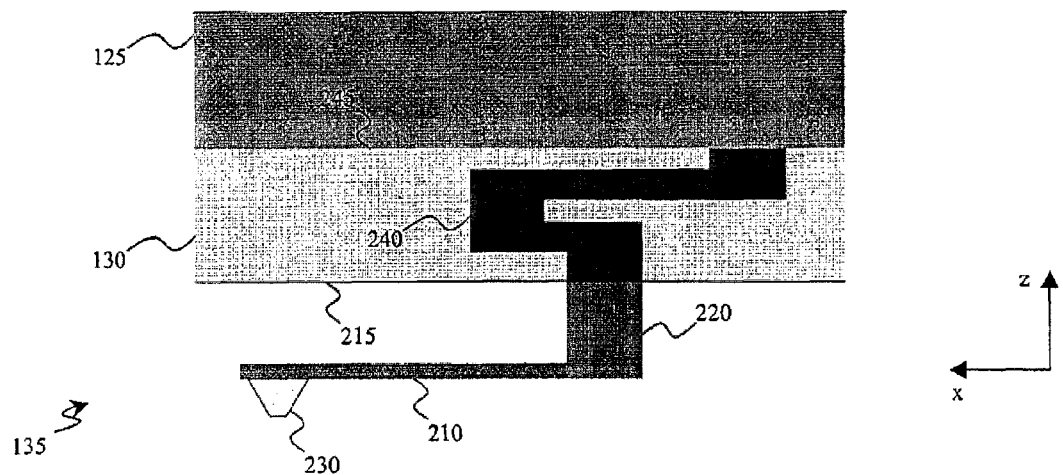
FIG. 2A schematically illustrates a MEMS probe adapted to be employed in the probe card of FIG. 1 according to an embodiment known in the art.

The FIG. 2A is a prospect view illustrating the structure of a MEMS probe 135 according to an embodiment known in the art. Particularly, the probe 135 comprises an elastic beam 210 of a conductor material (such as gold, silver, palladium, nickel, copper, manganese, tungsten, beryllium and corresponding alloys, or silicon) which extends substantially parallel to a bottom surface 215 of the substrate 130. For example, making use of the conventions used in FIG. 1, the elastic beam 210 may substantially extends along the x direction. An end of the elastic beam 210 is connected to the substrate 130 through a conductive pillar 220 which substantially extends along the z direction. The other end of the elastic beam 210 is provided with a protruding tip 230 adapted to electrically contact a contact pad 137 of the wafer 110 to be tested. The probe 135 may be possibly covered in part by at least one layer of conductor material in order to have proper electric and mechanic characteristics. The probe 135 is capable of exchanging test signals with the PCB 125 over the substrate 130 by means of a corresponding conductive track 240 which crosses the substrate 130. Particularly, a first end of such conductive track 240 is connected to the pillar 220 of the probe 135 by the bottom surface 215 of the substrate 130, while a second end is connected to the PCB 125 by a top surface 245 of the substrate 130 opposed to the bottom surface 215.

As already discussed above, a probe 135 structured in this way has a single conductive path that starts from the tip 230, crosses the elastic beam 210, continues along the pillar 220 and reaches the PCB 130 through the conductive track 240.

Figure 2B:
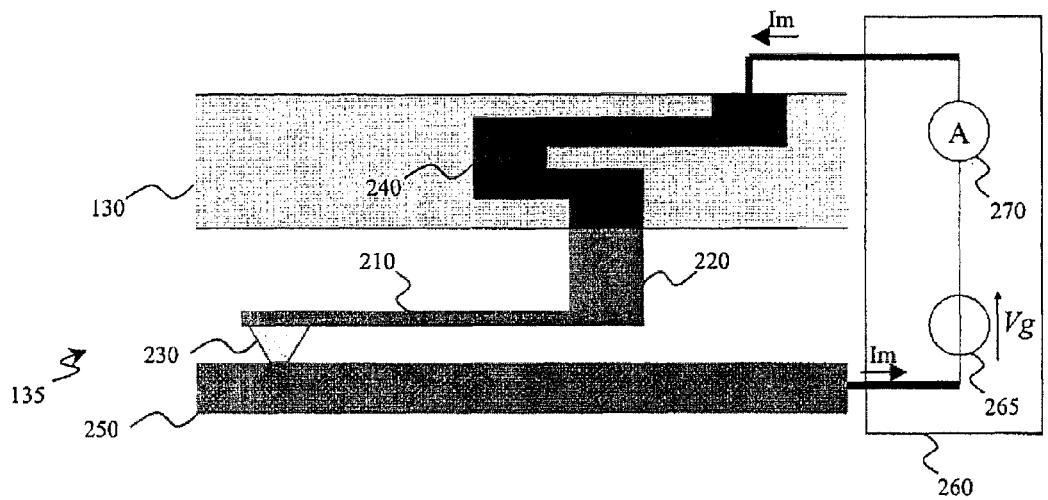
FIG. 2B illustrates a known method for verifying the integrity of the probe of FIG. 2A.

In FIG. 2B it is illustrated a method normally used for verifying the integrity of the probe 135. In order to consider the probe 135 as usable in a test operation, the conductive path defined by the probe has to be characterized by an equivalent electric resistance that is sufficiently reduced. Indeed, the electric resistance increasing due to the presence of possible defects, breakings or structural deformations of the probe 135 may be such to invalidate the correct transferring of the test signals from the circuits integrated in the wafer 110 to be tested to the tester and vice versa.

For this purpose, the probe card 105 is typically positioned on a metallic plate, identified in FIG. 2B with the reference 250. The metallic plate is electrically coupled with the end of the conductive track 240 on the top surface 245 of the substrate 130 by means of a resistance measuring device, identified with the reference 260.

For example, the measuring device 260 may include a voltage generator 265 adapted to generate a measuring voltage Vg having a predetermined value; the voltage difference applied between the metallic plate and the end of the conductive track 240 on the top surface 245 by such generator generates a current Im flowing through the path formed by: metallic plate, probe's tip, elastic beam, pillar, conductive track and voltage generator included in the measuring device. Knowing the resistance of the conductive track 240, of the metallic plate 250 and the internal resistance of the measuring device 260, it is possible to determine the equivalent resistance of the probe 135 by measuring the current Im by means of an amperometer 270.

As already mentioned in the introduction of the present document, positioning the probe card 105 on the metallic plate 250 may be dangerous, since it is possible to damage the tip 230 of the probe 135 in an irreversible way.

Although different methods for measuring the resistance of the probes 135 are known, for example making use of measuring devices different than the measuring device 260, the conformation of the conductive path of the probe 135 illustrated in FIG. 2A always requires a "closure" of the circuit between the conductive track 240 and the tip 230 of the probe 135. This requires that the tip 230—i.e. the most fragile part' of the probe 135 —is necessarily contacted in some way.

According to an embodiment of the present invention, such drawback is solved modifying the structure of the probe 135 in such a way that it may be crossed by current during the integrity verifying without having to necessarily contacting the tip 230. As will be more clear in the following to the present description, this results to be possible by providing the probe 135 with a conductive path which crosses all the probe 135 and that can by "closed" between two points arranged by the substrate 130.

Figure 3A:
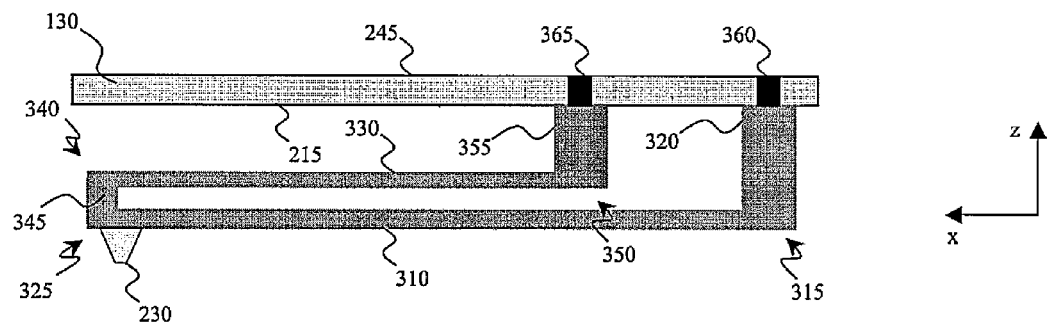
FIGS. 3A and 3B schematically show a MEMS probe according to an embodiment of the present invention.
Figure 3B:
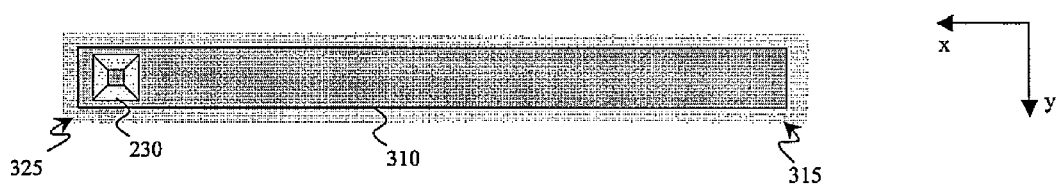

The FIGS. 3A and 3B illustrate in detail the structure of the probe 135 according to an embodiment of the present invention. Particularly, FIG. 3A shows the probe 135 according to a prospect view, while the FIG. 3B according to a top view.

According said embodiment, the probe 135 comprises a first elastic beam 310 of a semiconductor material which substantially extends along the x direction, i.e. it is substantially parallel to the bottom surface 215 of the substrate 130. An end 315 of such first elastic beam 310 is connected to the substrate 130 by means of a pillar 320 of semiconductor or conductor material which substantially extends along the z direction. The other end of the first elastic beam 310—identified in figure with the reference 325—is connected to the tip 230. The probe 135 comprises a second elastic beam 330 positioned at an height (along the z axis) different than the first elastic beam 310. For example, the second elastic beam 330 may be in a position closer to the bottom surface 215 of the substrate 130 with respect to the first elastic beam 310. An end 340 of the second elastic beam 330 is connected to the end 325 of the first elastic beam 310 by means of a conductive material connection element, indicated in the figure with the reference 345. The other end of the second beam 330—identified in the figure with the reference 350—is connected to the substrate 130 by means of a semiconductor or conductor material pillar 355 which substantially extends along the z direction. The probe 135 is capable of exchanging test signals with the PCB 125 by means of two conductive tracks which cross the substrate 130, identified with the references 360 and 365. Particularly, a first conductive track 360 is connected to the pillar 320 of the probe of the substrate 130, while a second conductive track 365 is connected to the pillar 355. Both the conductive tracks 360 and 365 cross the substrate 130 until the top surface 245.

Unlike the probe 135 illustrated in FIG. 2A, the probe 135 of FIGS. 3A and 3B has a conductive path that starts and ends on the top surface 245 of the substrate 130. Particularly, such conductive path crosses the conductive track 365, reaches the pillar 355, carries on along the elastic beam 330, continues trough the connection element 345 for reaching the elastic beam 310, carries on along the pillar 320 and reaches again the top surface 245 through the conductive path 365.

Thanks to the peculiar structure of the probe 135 illustrated in the FIGS. 3A and 3B, it is possible to measure the electric resistance of the conductive track—and, thus, to verify the effective integrity of the probe—in a easier and especially safer way, without having to contact the tip 230 in any way.

Figure 3C:
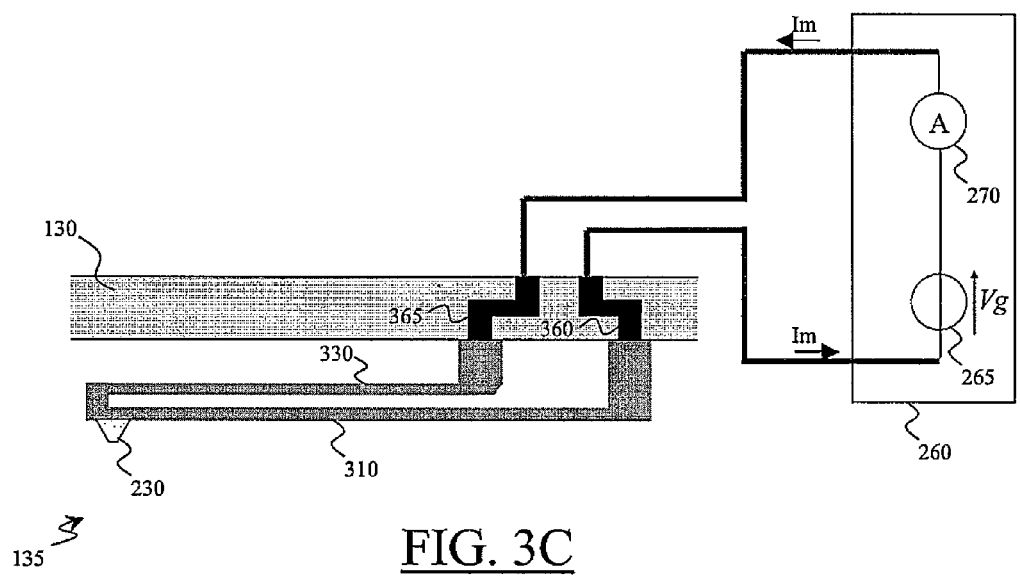
FIG. 3C illustrates a method for verifying the integrity of the probes of FIGS. 3A and 3B according to an embodiment of the present invention.

Particularly, as it is illustrated in FIG. 3C, according to an embodiment of the present invention it is sufficient to connect the measuring device 260 between the first conductive track 360 and the second conductive track 365. In this way, the current Im generated by the measuring device 260 flows through the path formed by: conductive track 365, pillar 355, second elastic beam 330, connection element 345, first elastic beam 310, pillar 320, conductive track 360 and voltage generator 265 within the measuring device 260; naturally, the path may be crossed in the opposite direction as well.

In case the MEMS probe is at least partially comprised into/surrounded by the sacrificial oxide (or any other equivalent sacrificial insulating material employed in a MEMS technology process) it is possible to perform the electrical test. Obviously the sacrificial oxide will be removed to use the probe.

It has to be noted that with this solution it may not be possible to verify with electrical measurements the correct operation of the tip 230 of the probe 135, since such tip 230 is not crossed by the current Im. However, in order to verify the integrity of the tip 230 it is sufficient to carry out an optical inspection, for assessing if the shape of the tip respects predetermined specifications or not.

The probe 135 may be connected to the PCB 125 with ease by short-circuiting the first conductive track 360 and the second conductive track 365 to a corresponding contact on the PCB 125.

Figure 4A:
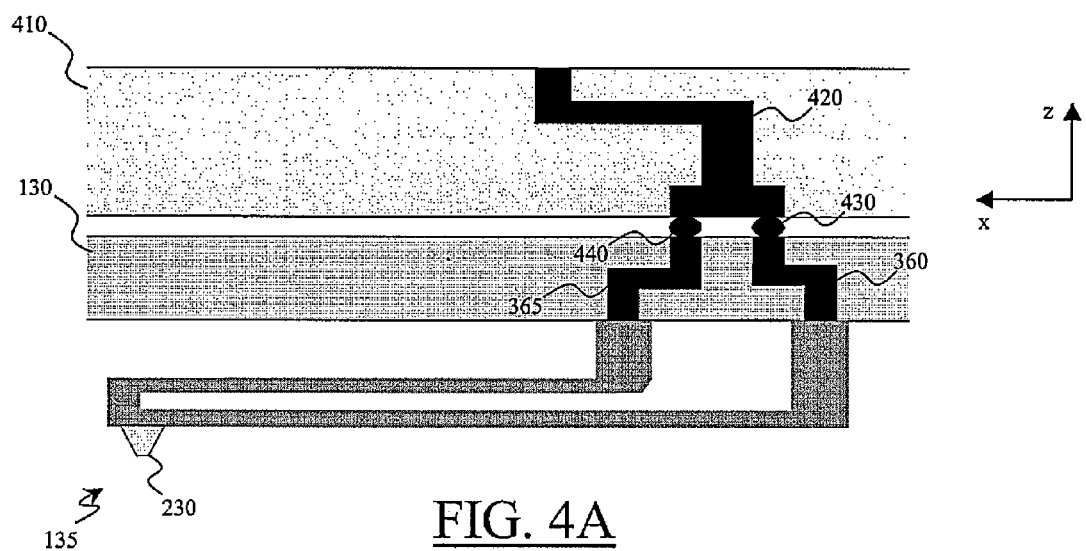
FIGS. 4A and 4B illustrates how the probe of FIGS. 3A and 3B may be connected to a substrate according to two embodiments of the present invention.

Alternatively, according to an embodiment of the present invention illustrated in FIG. 4A, it is possible to provide a further substrate—identified with the reference 410—including a single conductive track 420, and connecting an end of such conductive track to the first conductive track 360 by means of a first contact terminal 430 and to the second conductive track 365 by means of a second contact terminal 440. In this way, the test signals are capable of reaching the tip 230 of the probe 135 even if one of the two contact terminals 430, 440 results to be defective. These considerations also apply to the performance degradation of the probe 135 due to the passing of time. This embodiment is particularly but not exclusively useful for high current applications.

Figure 4B:
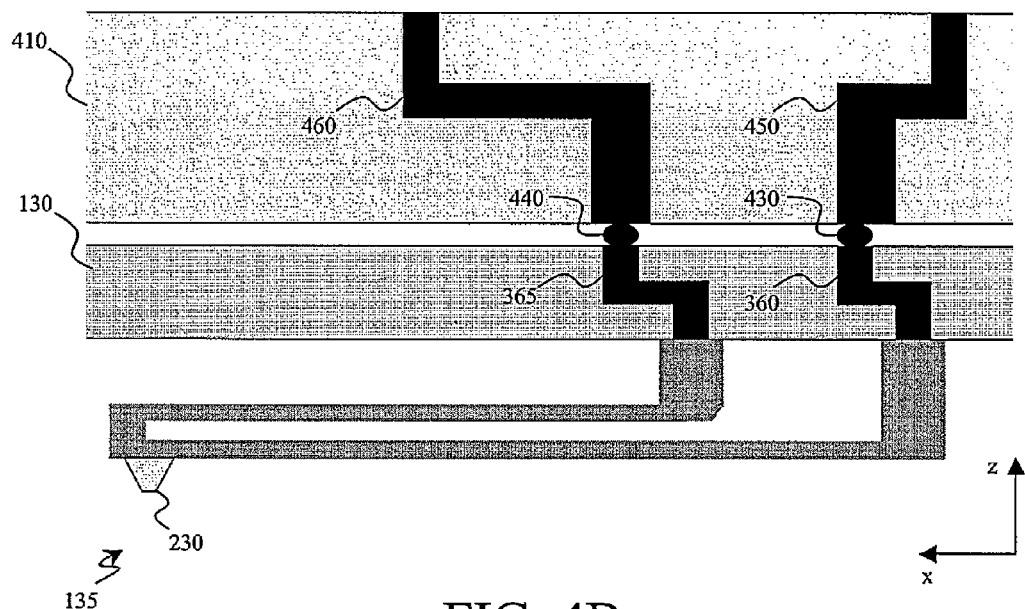

According to a further embodiment of the present invention illustrated in FIG. 4B, the substrate 410 may be provided with two distinct conductive tracks, each one adapted to be contacted to a respective conductive track in the substrate 130. Particularly, the substrate 410 includes a conductive track 450 connected to the first conductive track 360 by means of the first terminal 430 and a second conductive track 460 connected to the second conductive track 365 by means of the second terminal 440. Then, the conductive tracks 450 and 460 may be connected, for example, to different electronic systems or circuits on the PCB 125 or external systems connected to the PCB 125.

Figure 5A:
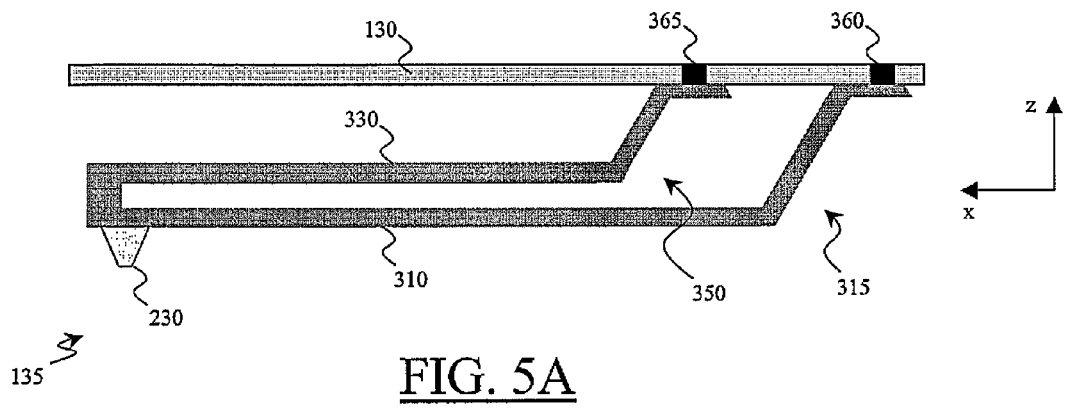
FIGS. 5A and 5B schematically illustrates a MEMS probe according to a further embodiment of the present invention.
Figure 5B:
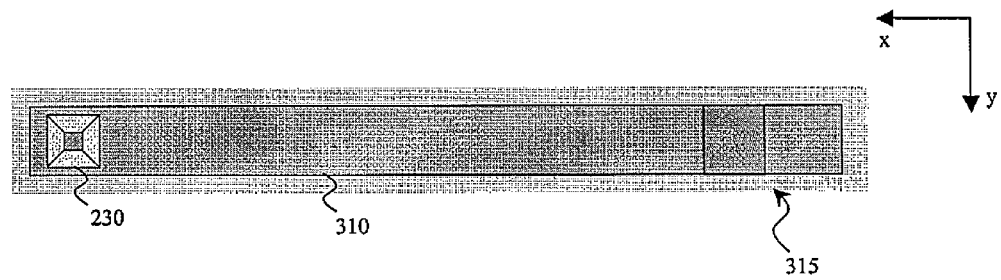

According to an alternative embodiment of the present invention, the probe 135 may be connected to the substrate 130 by directly connecting the beams to the substrate 130. For example, in the probe 135 illustrated, in the FIGS. 5A and 5B, the first elastic beam 310 and the second elastic beam 330 are shaped in such a way to exhibit folds with a component in the z direction at the ends 315 and 350, respectively. In this way, by directly connecting the end 315 of the first elastic beam 310 to the first conductive track 360 in the substrate 130 and the end 350 of the second elastic beam 330 to the second conductive track 365, the probe may receive/transmit test signals from/to the PCB 125 (and, thus, from/to the tester) without any pillar.

Figure 6:
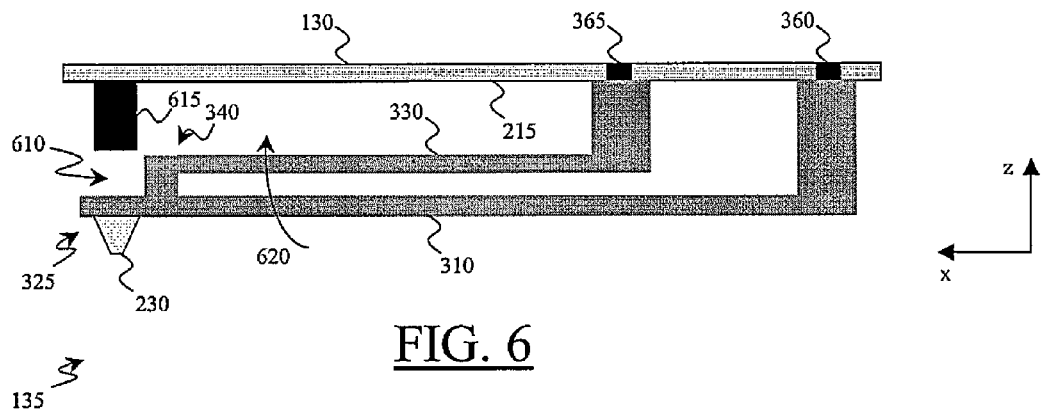
FIG. 6 schematically shows a MEMS probe according to a still further embodiment of the present invention.

According to a further embodiment of the present invention, illustrated in FIG. 6, it is possible to provide an housing 610 in the end of the probe 135 coupled with the tip 230, for example by connecting the connection element 345 between the end 340 of the second elastic beam 330 and an intermediate point (but close to the end 325) of the first elastic beam 310. In this way, by connecting to the bottom surface 215 of the substrate 130 a protruding blocking element 615 adapted to cooperate with the housing 610 when the probe is subjected to a deformation—whose direction is indicated with the reference 620—generated in response to possible excessive pressures of the wafer 110 to be tested against the probe card 105, it is possible to safeguard the integrity of the probe 135.

Figure 7A:
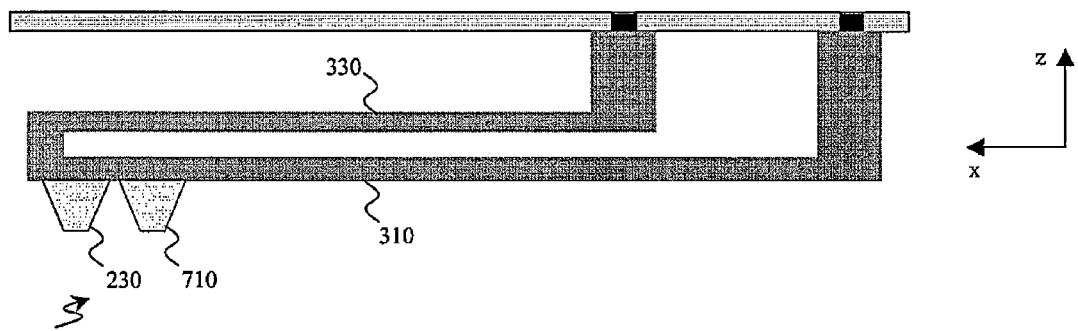
FIGS. 7A and 7B schematically illustrate a MEMS probe according to an embodiment of the present invention.
Figure 7B:
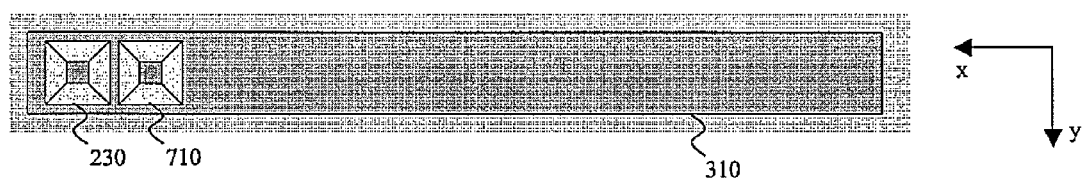
Figure 8A:
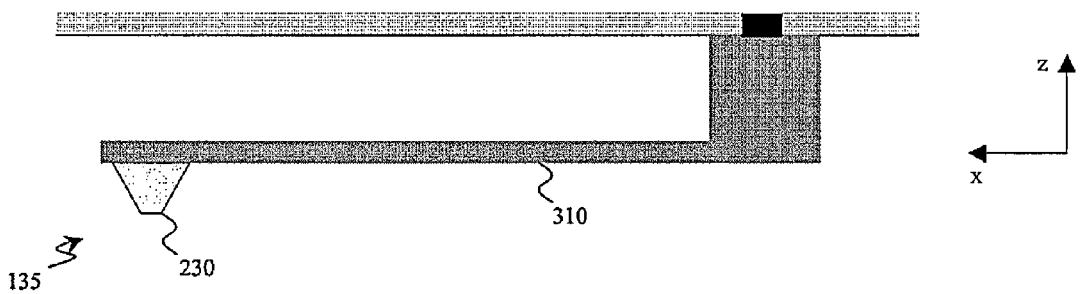
FIGS. 8A and 8B schematically illustrate a MEMS probe according to an alternative embodiment of the present invention.
Figure 8B:
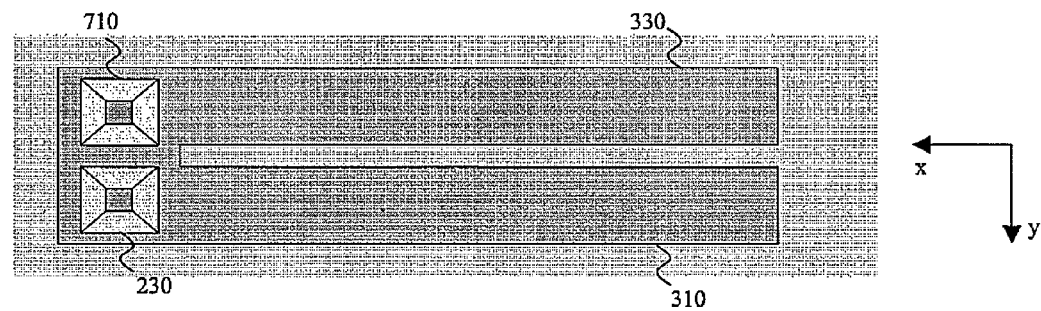

Being provided with two distinct beams 310, 330, the probe 135 according to one of the embodiments of the present invention may conduct currents having relatively high values. In this way, it is possible to increment the maximum current a MEMS probe may conduct, which, as it is well known, is lower than the maximum current a probe of the cantilever type or fabricated by means of vertical technologies is able to conduct. On this regard, as illustrated in the FIGS. 7A and 7B, the probe may be provided with at least one additional tip, identified with the reference 710. It has to be noted that in case of high currents, the contact pads 137 formed on the dice 102 of the wafer 110 to be tested which will be contacted by the probes 135, as well as the probe tip surfaces, will have an higher size. In this case, the bonds on the size of the probes 135 are less restrictive, and thus it is possible to simplify their structure. Particularly, in the probe 135 according to an embodiment of the present invention illustrated in the FIGS. 8A and 8B, the first elastic beam 310 and the second elastic beam 330 are arranged side to side on a same plane at a same distance (according the z direction) from the bottom surface 215 of the substrate 130.

Figure 9A:
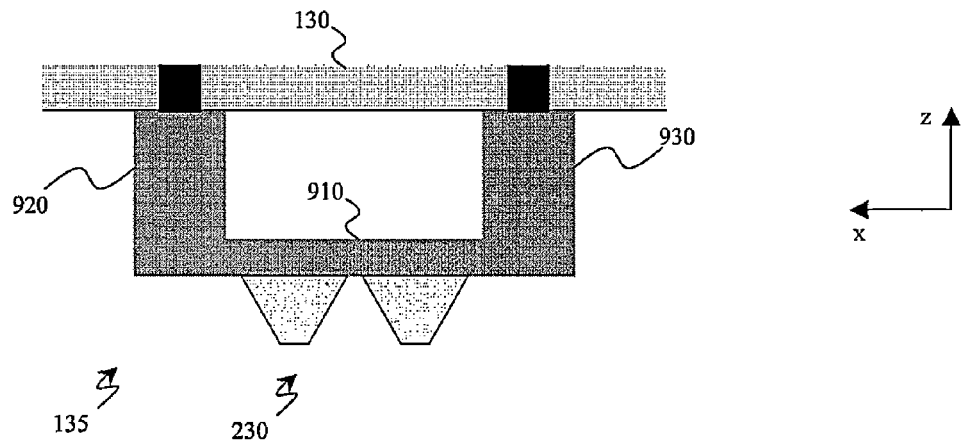
FIGS. 9A and 9B schematically illustrate a MEMS probe according to a still further alternative embodiment of the present invention, and FIGS. 10A and 10B schematically illustrate a MEMS probe according to a further embodiment of the present invention.
Figure 9B:
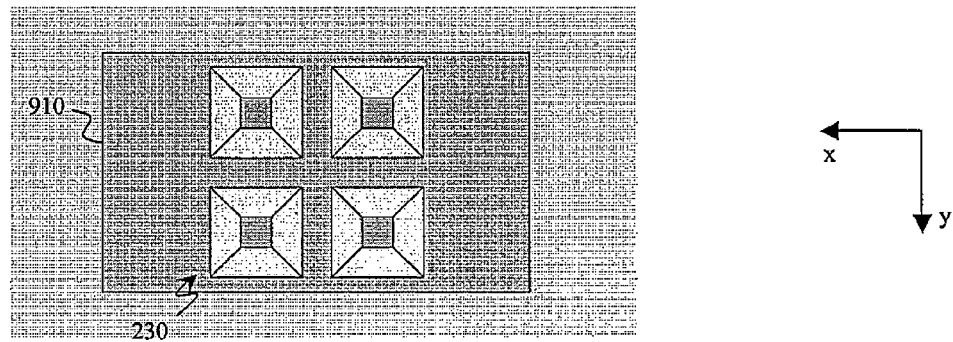

According to a further embodiment of the present invention illustrated in the FIGS. 9A and 9B, it is possible to provide a single beam—identified with the reference 910—connected to the substrate 130 by means of two pillars 920, 930 connected with opposed ends of the beam 910; one or more tips 230 may be positioned on the median portion of the beam 910.

The double-beam structure according to one embodiment of the present invention may be advantageously employed for implementing a termocouple or a temperature sensor adapted for example to efficiently measure the temperature of the devices integrated in the dice 102 of the wafer 110 to be tested by directly using the probe card 105. The probe 135 illustrated in the FIGS. 8A and 8B may be easily employed as a termocouple, realizing for example the first elastic beam 310 with a material different than that of the second elastic beam 330 to the purpose of exploiting the Seebeck effect for measuring a temperature value based on a corresponding voltage difference developing across the first elastic beam 310 and the second elastic beam 330. Moreover, by realizing the first elastic beam 310 with a material different than that of the second elastic beam 330, the probe 135 may be employed to set a specific temperature in a certain area of a device integrated in the dice 102 of the wafer 110 or to transfer heat from such device to the probe card 105 through the probe (e.g., so as to chill the device) by properly biasing the probe and then exploiting the Peltier effect.

Figure 10A:
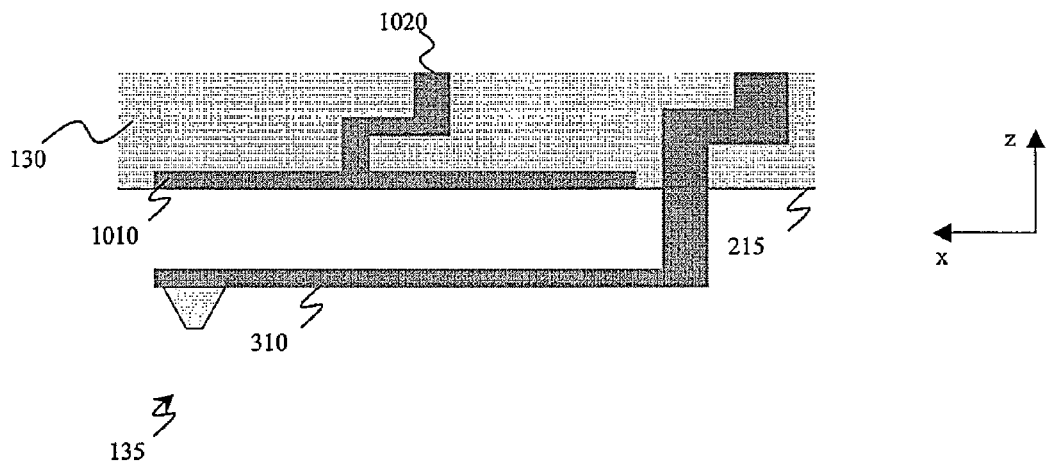
Figure 10B:
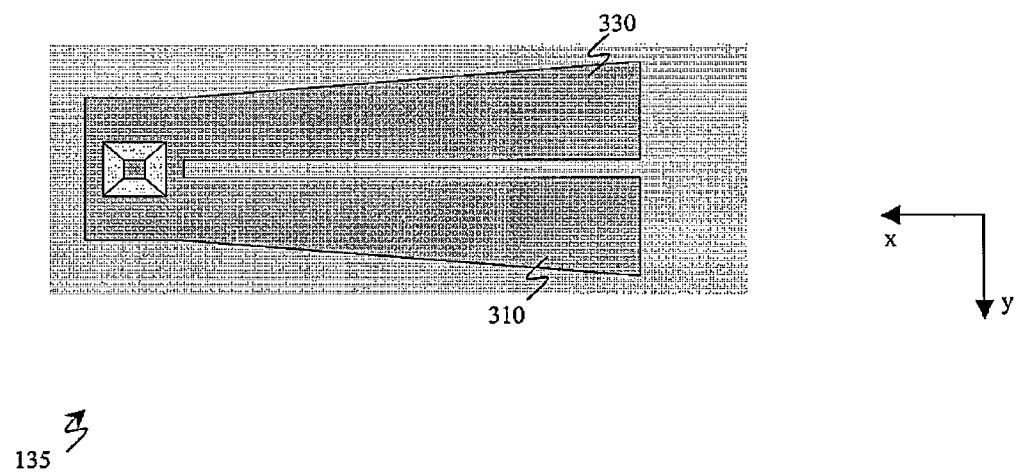

According to a further embodiment of the present invention, it is possible to exploit the probe 135 for efficiently measuring the pressure exerted by the wafer 110 against the probe card 105 during the test operations. Particularly, making reference to the FIGS. 10A and 10B, the beams 310 and 330 of the elastic probe 135 may be advantageously employed for forming the bottom plate of a capacitor; the top plate of such capacitor—identified in figure with the reference 1010—may be implemented by means of a metallic layer formed on the bottom surface 215 of the substrate 130 properly connected to a conductive track 1020 formed in the substrate 130 itself. During the test operations, the beams 310 and 330 are subjected to a deformation which depends on the pressure exerted by the wafer 110 against the probe card 105. The effect of such deformation changes the value of the capacitor's capacitance; particularly, the value of the capacitance increases when the beams 310 and 330 of the probe 135 come close to the bottom surface 215 of the substrate 130. As a consequence, by measuring the capacity of the capacitor using a proper capacitance measuring device (not illustrated in figure) it is possible to obtain an information on the actual pressure exerted by the wafer 110. In order to improve the reliability of the measure, it is convenient to increase the width of the beams 310 and 330 (along the y direction), and thus increasing the capacitive coupling between the plates. For example, the beams 310 and 330 illustrated in the FIG. 10B have a tapered shape, whose width (along the y direction) increases as approaching to the pillars connected to the substrate 130. According to an alternative embodiment of the present invention the bottom plate of the capacitor may be implemented using a probe with a singular beam having a higher width (along the y direction). Advantageously, this structure may be employed for increasing or reducing the pressure exerted by the probe 135 on the wafer 110 by properly biasing the two plates of the capacitor by means of a proper biasing device (not shown in the figure).

Regarding the production of the various probes proposed according to the embodiments of the present invention, it is sufficient to exploit any one among the MEMS manufacturing lithographic process known to the skilled in the art, starting for example from a sacrificial substrate formed for example by a semiconductor material wafer, and then soldering the probes to the final substrate, or using the semiconductor material wafer as the final substrate.

Naturally, in order to satisfy local and specific requirements, a person skilled in the art may apply to the solution described above many modifications and alterations. Particularly, although the present invention has been described with a certain degree of particularity with reference to preferred embodiment(s) thereof, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

Particularly, the concepts of the present invention may be applied to any type of MEMS probe known to the skilled technician, but that has not been described in detail.

For example, the probes 135 according to any one among the embodiments of the present invention may be arranged in more than one level, aligned along a same axis with respect the plane (x, y)—or with a little deviation-, include beams 310, 330 provided with multiple folds with components along the directions x, y, z, or being provided with tips 320 having different shape and size, in such a way to be capable of better optimize the electric contact with the contact pads 137 formed on the dice 102 of the wafer 110 to be tested.

Moreover, the proposed double-beam structure may be advantageously exploited for forming an electric link with protruding contact regions ("bumps") formed on the wafer 110, for example arranging a plurality of tips on each beam 310, 330 adapted to cooperate with such bumps.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A microelectromechanical probe adapted to contact a corresponding terminal of an integrated circuit that is integrated on at least one chip of a semiconductor material wafer during a test phase of the wafer, said probe including:
    a support structure comprising a first access terminal and a second access terminal, said support structure defining a conductive path along a first beam element and a second beam element between said first access terminal and said second access terminal, wherein the first beam element is substantially parallel to the second beam element;
    a probe region connected to the support structure, said probe region comprising at least one conductive tip adapted to contact the corresponding terminal of the integrated circuit during the test phase for:
    providing at least one test signal received from the first access terminal and the second access terminal to the integrated circuit through at least one portion of the conductive path, and/or
    providing at least one test signal generated by the integrated circuit to at least one between the first access terminal and the second access terminal trough at least one portion of the conductive path,
    wherein said probe region is arranged on the conductive path of the support structure between said first access terminal and said second access terminal.

2. The probe according to claim 1, wherein the probe is adapted to be connected to a first surface of a substrate element comprising a first conductive track and a second conductive track, said first access terminal and said second access terminal being adapted to be connected to the first conductive track and to the second conductive track, respectively, for providing/receiving the at least one test signal.

3. The probe according to claim 2, wherein said first beam element extends along a direction substantially parallel to the first surface of the substrate element, a portion of said conductive path being defined by said first beam element.

4. The probe according to claim 3, wherein the probe region is connected to the first beam element.

5. The probe according to claim 3, wherein:
    the first beam element is connected to the first conductive track by means of a first pillar element and the second beam element is connected to the second conductive track by means of a second pillar element, a further portion of said conductive path being defined by said first and second pillar elements; and
    the first beam element is connected to the second beam element by means of a link element, a still further portion of said conductive path being defined by said link element.

6. The probe according to claim 5, wherein:
    the first pillar element and the second pillar element are connected to a first end of the first beam element and to a first end of the second beam element, respectively;
    the link element is connected to a second end of the first beam element and to a second end of the second beam element; and
    the probe region is connected to the second end of at least one between the first and the second beam elements.

7. Use of a probe adapted to contact a corresponding terminal of an integrated circuit, which is integrated on at least one chip of a semiconductor material wafer, as a device for measuring the temperature of the terminal,
    wherein said probe is the probe of claim 5; and
    the first beam element is made of a conductive material of a first type, and the second beam element is made of a conductive material of a second type different from the first one, said use comprising:

measuring a voltage difference between the first beam element and the second beam element, and measuring the temperature of said terminal based on said voltage difference.

8. Use of a probe adapted to contact a corresponding terminal of an integrated circuit, which is integrated on at least one chip of a semiconductor material wafer, as a device for exchanging heat with the terminal, wherein said probe is the probe of claim 5; and the first beam element is made of a conductive material of a first type, and the second beam element is made of a conductive material of a second type different from the first one, said use comprising:

biasing the probe with a biasing voltage, and exchanging heat with the terminal based on a corresponding voltage difference developing between the first beam element and the second beam element because of said biasing voltage.

9. A probe card comprising a board adapted to a test apparatus, and a plurality of probes coupled to said board by means of a substrate element, wherein said probes comprise at least one probe according to claim 1, and wherein said probe card is adapted to be used for testing at least one integrated circuit.

10. A test apparatus comprising:

a probe card adapted to provide a communication interface between a tester and the at least one chip of the semiconductor material wafer, wherein the probe card is constructed according to claim 9.

11. Use of a probe card adapted to be used for testing at least one integrated circuit, which is integrated on at least one corresponding chip of a semiconductor material wafer, for measuring the pressure exerted by the semiconductor material wafer against the probe card, the probe card comprising a board adapted to couple to a test apparatus, and a plurality of probes coupled with said board by means of a substrate element, wherein said probes include at least one probe according to claim 1; and the substrate element includes a metallic layer in correspondence of the at least one probe, said metallic layer and said at least one probe defining the plates of a capacitor, said use comprising:

measuring the capacity of said capacitor, and measuring the pressure exerted by the semiconductor material wafer against the probe card based on the measured capacity.

12. Use of a probe card adapted to be used for testing at least one integrated circuit, which is integrated on at least one corresponding chip of a semiconductor material wafer, for controlling the pressure exerted by the semiconductor material wafer against the probe card, the probe card comprising a board adapted to couple to a test apparatus, and a plurality of probes coupled with said board by means of a substrate element, wherein said probes include at least one probe according to claim 1; and the substrate element includes a metallic layer in correspondence of the at least one probe, said metallic layer and said at least one probe defining the plates of a capacitor, said use comprising:

biasing said capacitor with a biasing voltage, and controlling the pressure exerted by the semiconductor material wafer against the probe card based on such biasing voltage.

13. A method for verifying the integrity of a microelectromechanical probe adapted to contact a corresponding terminal of an integrated circuit that is integrated on at least one chip of a semiconductor material wafer during a test phase of the wafer, said probe including:

a support structure comprising a first access terminal and a second access terminal, said support structure defining a conductive path between said first access terminal and said second access terminal;

a probe region connected to the support structure between said first access terminal and said second access terminal, said probe region comprising at least one conductive tip adapted to contact the corresponding terminal of the integrated circuit during the test phase for:

providing at least one test signal received from the first access terminal and the second access terminal to the integrated circuit through at least one portion of the conductive path, and/or providing at least one test signal generated by the integrated circuit to at least one between the first access terminal and the second access terminal trough at least one portion of the conductive path, said probe region is arranged on the conductive path of the support structure between said first access terminal and said second access terminal, said method for verifying including:

accessing the first and the second access terminals with a measuring device;

stimulating the support structure with said measuring device in such a way the conductive path is crossed by a measuring current (Im), and assessing the integrity of the probe based on the measuring current.

14. A microelectromechanical probe comprising:

a probe support structure having a first fixed end and a second fixed end, wherein the probe support structure extends from a substrate;

a conductive path on the probe support structure extending from the first fixed end to the second fixed end along a first beam element and a second beam element, wherein the first beam element is substantially parallel to the second beam element and the conductive path is a path through which applied current will flow between the first fixed end and the second fixed end;

a first access terminal at a first end of the conductive path configured to connect to a first node of a circuit;

a second access terminal at a second end of the conductive path configured to connect to a second node of a circuit different than the first node; and a conductive probe extending from the probe support structure on the conductive path at a location between the first fixed end and second fixed end, wherein the conductive probe is coupled to the conductive path and is adapted to contact a contact pad of an integrated circuit.

15. The microelectromechanical probe of claim 14, wherein the conductive probe comprises at least one conductive tip.

16. The microelectromechanical probe of claim 14, further comprising:

a first conductive pillar connected between the conductive path at the first fixed end and a first conductive track on the substrate; and a second conductive pillar connected between the conductive path at the second fixed end and a second conductive track on the substrate.

17. The microelectromechanical probe of claim 14, further comprising:
   a first conductive track coupled to the conductive path at the first fixed end; and
   a second conductive track coupled to the conductive path at the second fixed end.

18. The microelectromechanical probe of claim 17, wherein the first or second access terminal is configured to transmit an electrical test signal to the integrated circuit when the conductive probe is in contact with the contact pad.

19. The microelectromechanical probe of claim 17, wherein the first or second access terminal is configured to receive an electrical signal from the integrated circuit when the conductive probe is in contact with the contact pad.

20. The microelectromechanical probe of claim 17, wherein the first access terminal is configured to transmit an electrical signal along the conductive path to the second access terminal when the conductive probe is not in contact with the contact pad.

21. The microelectromechanical probe of claim 17, further comprising a conductive plate disposed on the substrate proximal the probe support structure, wherein the conductive plate and the probe support structure form a capacitive element.

22. The microelectromechanical probe of claim 21, wherein the conductive plate is coupled to a third access terminal.

23. The microelectromechanical probe of claim 17 incorporated in a probe card that includes a plurality of probes for testing at least one integrated circuit at a plurality of points.

24. The microelectromechanical probe of claim 23, wherein the probe card is coupled to a test apparatus adapted to test a plurality of points of the at least one integrated circuit.

25. The microelectromechanical probe of claim 14, wherein the first beam element is made of a conductive material of a first type and the second beam element is made of a conductive material of a second type different from the first type.

26. A method for operating a microelectromechanical probe, the method comprising:
   applying a test signal to a first end of a conductive path of the microelectromechanical probe, wherein the conductive path runs from a first fixed end of a probe support structure to a second fixed end of the probe support structure, the probe support structure extends from a substrate, and a conductive probe for electrically contacting a contact point extends from the probe support structure on the conductive path at a location between the first fixed end and second fixed end of the probe support structure;
   measuring for a signal received from a second end of the conductive path; and
   determining the integrity of the microelectromechanical probe based upon the measuring.

27. The method of claim 26, wherein the applying comprises applying a voltage across the first end and second end of the conductive path by way of first and second access terminals coupled to the first end and second end of the conductive path, respectively.

28. The method of claim 26, wherein the measuring comprises measuring an electrical current carried by the conductive path.

29. The method of claim 26, further comprising:
   contacting the conductive probe to a contact pad of an integrated circuit; and
   applying a test signal to one or both of the first and second ends of the conductive path.

30. The method of claim 26, further comprising:
   contacting the conductive probe to a contact pad of an integrated circuit; and
   receiving a signal from the integrated circuit via one or both of the first and second ends of the conductive path.

31. The method of claim 26, wherein the probe support structure comprises a flexible beam.

32. The method of claim 26, wherein the probe support structure comprises a first flexible beam made of a conductive material of a first type and a second flexible beam made of a conductive material of a second type different from the first type, the method further comprising:
   contacting the conductive probe to a contact pad of an integrated circuit;
   measuring a voltage difference between the first flexible beam and the second flexible beam; and
   determining a temperature of the contact pad based on the measured voltage difference.

33. The method of claim 26, wherein the probe support structure comprises a first flexible beam made of a conductive material of a first type and a second flexible beam made of a conductive material of a second type different from the first type, the method further comprising:
   contacting the conductive probe to a contact pad of an integrated circuit; and
   biasing the microelectromechanical probe to control a temperature at the integrated circuit.

34. The method of claim 26, wherein the substrate includes a conductive plate such that the conductive plate and the probe support structure form a capacitive element, the method further comprising:
   contacting the conductive probe to a contact pad of an integrated circuit;
   measuring a value of capacitance of the capacitive element; and
   determining a force exerted on the microelectromechanical probe based upon the measured value of capacitance.

35. The method of claim 26, wherein the substrate includes a conductive plate such that the conductive plate and the probe support structure form a capacitive element, the method further comprising:
   contacting the conductive probe to a contact pad of an integrated circuit;
   applying a bias to the conductive plate to alter a force exerted by the microelectromechanical probe on the contact pad.

* * * * *